United States Patent [19]

Ishino et al.

[11] Patent Number: 4,933,580

[45] Date of Patent: Jun. 12, 1990

[54] MAGNETO-STRICTIVE TORQUE SENSOR

[75] Inventors: Renshiro Ishino; Shigeo Yoshimura; Yoshio Shibata, all of Amagasaki, Japan

[73] Assignee: Kubota, Ltd., Osaka, Japan

[21] Appl. No.: 361,947

[22] Filed: Jun. 5, 1989

[30] Foreign Application Priority Data

Feb. 22, 1989 [JP] Japan ................................. 1-42544

[51] Int. Cl.$^5$ ............................................. H01L 41/12
[52] U.S. Cl. ................................. 310/26; 73/862.36; 73/660; 73/DIG. 2
[58] Field of Search ................ 310/26; 73/650, 660, 73/DIG. 2, 862.08, 862.36

[56] References Cited

U.S. PATENT DOCUMENTS

| | | | |
|---|---|---|---|
| 3,464,042 | 8/1969 | Raman | 310/26 X |
| 3,505,657 | 4/1970 | Whitehouse | 310/26 X |
| 4,122,708 | 10/1978 | Maier | 73/862.34 |
| 4,694,902 | 9/1987 | Hormansdorfer | 73/151 |
| 4,716,556 | 12/1987 | Raskin et al. | 310/26 X |

*Primary Examiner*—Mark O. Budd
*Attorney, Agent, or Firm*—Joseph W. Farley

[57] ABSTRACT

A magneto-strictive torque sensor for electrically contactlessly detecting a torque applied to a rotary shaft on the basis of a resulting change in the magnetic permeability of the surface of the shaft. Fine dents and retainer areas for retaining residual compressive stress due to the fine dents are formed on the surface of the rotary shaft. According to this arrangement, the process of magnetization resulting from the application of an exciting magnetic field and of the torque to the rotary shaft involves less magnetization due to magnetic domain wall displacement and consists principally of reversible magnetic rotation, with the result of reduced hysteresis in the magnetization process. The reduced hysteresis causes less hysteresis involved in torque detection and higher detection sensitivity, thus resulting in high accuracy of torque detection. Further, by working the surface of the rotary shaft for the purpose of forming the fine dents thereon, microdefects present on the surface layer of the rotary shaft are reduced or eliminated and thus reduced hysteresis and improved sensitivity can be attained in the process of torque detection.

11 Claims, 5 Drawing Sheets

MAGNETO-STRICTIVE TORQUE SENSOR

FIELD OF THE INVENTION

The present invention relates to a magneto-strictive torque sensor for contactlessly detecting torque applied to a rotary shaft on the basis of a change in the magnetic permeability of the surface of the shaft.

BACKGROUND OF THE INVENTION

For contactless detection of torque applied to a rotary shaft of a rotary drive system in electric motors, machine tools, automobiles, and the like, magneto-strictive torque sensors are widely used in which an alternating field is applied to the surface of the shaft so that a change in the magnetic permeability of the shaft surface which arises from application of torque to the rotary shaft is detected in terms of quantity of electricity.

One known type of such magneto-strictive sensor is of the magnetic head system in which a coil winding (a magnetic head) having an open magnetic circuit type iron core, such as U-shaped iron core, is disposed adjacent the shaft to serve as exciting and detecting means, whereby a change in the magnetic permeability of the shaft surface in the direction of principal stress (a direction having an angular inclination of ±45 deg. relative to the axial direction of the shaft) which arises from application of torque to the shaft is detected ("Magnetic Measurement of Torque in a Rotating Shaft", The Review of Scientific Instruments, Vol. 25, No. 6, June 1954). Another known type is the solenoid coil system in which uniaxial magnetic anistrophy imparted to the surface of a rotary shaft in an axially inclined direction forms an axis of easy magnetization and, in proximity to the shaft portion to which the magnetic anisotropy is imparted, an exciting solenoid coil (exoiting coil) and a solenoid coil for detecting changes in magnetic permeability (deteoting coil) are arranged around the shaft so that an axial change in the magnetic permeability which is caused by torque application is detected ("A New Torque transducer using Stress Sensitive Amorphous Ribbons", IEEE Trans. on Mag., MAG-18, No. 6, 1769-9, 1982).

For imparting magnetic anisotropy to the surface of the rotary shaft in such torque sensor of the solenoid coil system, there is known a method in which, as described in Japanese Patent Laid Open Publication No. 63-252487, for example, a plurality of belt-like hardened sections parallel to one another in a direction having an angular inclination relative to the axial direction of the shaft are formed on the shaft surface by laser quenching to create residual stress so that, as the effect of the stress, magnetic anisotropy is imparted to the shaft surface. Among other known methods there is one described in Japanese Patent No. 169326, for example, in which a plurality of spiral grooves parallel to one another are formed on the shaft surface by rolling or otherwise so that, as the configurational effect of the grooves, shape magnetic anisotropy is given to the shaft surface.

Changes in the spontaneous magnetization of a ferromagnetic material which are caused by external magnetic field and/or stress acting on the rotary shaft include the process of magnetization due to magnetic domain wall displacement and the process of magnetization due to rotational magnetization which follows the first mentioned domain wall displacement. The process of magnetization due to rotational magnetization is mainly reversible. The process of magnetization due to magnetic domain wall displacement includes the process of reversible magnetization and the process of irreversible magnetization. Unless the external magnetic field and/or active stress is extremely small or unless it is noticeably large, the process of magnetization due to magnetic domain wall displacement is irreversible. This is attributable to the fact that magnetic domain wall displacement is hampered by microfine foreign matters (impurities), grain boundaries, lattice defects, etc. which are present in multiplicity in the ferromagnetic material. Unlike the process of reversible magnetization, the process of magnetization in which magnetic domain wall displacement is largely non-reversible involves hysteresis.

In actual torque sensors, magnetic field applied to the surface of the rotary shaft is usually faint (generally not more than 10 Oe) and, therefore, the process of magnetization on the surface of a conventional rotary shaft made of a magnetically soft material of high strength (coercive force Hc: about 10–20 Oe) is largely of irreversible magnetization due to magnetic domain wall displacement. As such, hysteresis cannot be avoided in the process of magnetization. The hysteresis in the process of magnetization appears as hysteresis in the detection characteristics of the torque sensor, thus adversely affecting the accuracy of torque detection.

On the surface of the rotary shaft there are present not a few defects, such as burrs and hair cracks, though extremely small, which were produced in the machining and groove forming stages. These microdefects can be a cause of hysteresis in the torque detection characteristics or reduced sensitivity. Fatigue of the material of the rotary shaft due to repeated application of torque to the shaft, and intergranular slip due to application of large torque are also likely to cause increased hysteresis in torque detection and reduced detection sensitivity.

SUMMARY OF THE INVENTION

It is an object of the invention to convert the process of magnetization on the surface of a rotary shaft into a process of magnetization which is mainly of rotational magnetization less liable to hysteresis in magnetization and to eliminate microdefects on the surface and provide improved resistance to intergranular slip on the surface layer of the shaft, thereby to minimize possible hysteresis in torque detection characteristics and obtain improved detection sensitivity.

In order to accomplish the foregoing object, the present invention provides a magneto-strictive torque sensor of the type in which an exciting magnetic field is applied to a magneto-anisotropic zone formed on the surface of a predetermined region of a rotary shaft so that a change in the magnetic permeability of the magneto-anisotropic zone which arises from torque being applied to the rotary shaft is contactlessly detected by magnetic detecting means in terms of quantity of electricity characterized in that fine dents and retainer areas for retaining residual compressive stress due to the fine dents are formed on the surface of the rotary shaft over a predetermined region including the magneto-anisotropic zone so that they are substantially uniformly distributed over the region.

Fine dents on the surface of the rotary shaft are formed by shot peening, a process in which rigid spherical materials, such as pig iron and cast steel, of fine particle size are sprayed onto the shaft surface by utilizing compressed air or centrifugal force, or by rolling or knurling, a process in which a roll forming tool having a multiplicity of fine protrusions on the surface thereof is pressed against the shaft surface (and where required, such pressing is repeated.)

Through the provision of fine dents formed on the surface of a ferromagnetic material, magnetic domains parallel to the tensile residual stress around the dents are stabilized and, as the effect of residual stress introduced through the formation of the dents, a stabilized region of magnetic domains which generally concentrically encompasses the dents is formed. It is known that the peripheral area of the dents is little subject to magnetic domain wall displacement in the change process of spontaneous magnetization under external magnetic field or stress acting on the shaft and the magnetizatIon of the area takes a magnetization process which is mainly of reversible rotational magnetization (see , for example , "Jiseitai Handbook (Handbook of Magnetic Material)", p895, 1975, Asakura Publishing Co., Japan).

Therefore, in that region on the surface of the rotary shaft in which a multiplicity of fine dents are formed in a minutely distributed pattern, the process of magnetization which takes place through the application of exciting magnetic field and torque is different from that in the case where no fine dents is present, in the fact that the process involves less magnetization due to magnetic domain wall displacement and is largely of reversible rotational magnetization, with the result of reduced hysteresis in the process of magnetization. As a consequence of the reduced hysteresis due to the formation of the fine dents, torque detection in the above mentioned region as an excitation/detection region involves less hysteresis in the detection characteristics thereof.

On the surface layer of the rotary shaft fabricated through the process of machining and groove forming there are scatteringly present a multiplicity of microdefects, such as burns and hair cracks, produced in the course of machining and groove forming, which can be a cause of increased hysteresis and reduced detection sensitivity as already noted. However, by virtue of the fine dents formed on the surface of the shaft, those microdefects are diminished or eliminated and as a result the process of torque detection involves less hysteresis and shows improved sensitivity. This effect is particularly noticeable where shot peening is applied. Where rolling or knurling is carried out by employing a rolling tool, a favorable result can be obtained as well by repeating the process.

The surface of the rotary shaft in the region in which a multiplicity of fine dents are scatteringly formed has a metallic texture compressed and densified by dent forming. The surface layer of the shaft is rendered rigid as a result of work hardening due to the process of dent forming. Such densification by compression and hardening of the surface layer are also effective in increasing the fatigue resistance and intergranular slip resistance of the surface layer and result in reduced hysteresis in torque detection characteristics.

Fine dent forming on the predetermined region of the rotary shaft surface may be carried out after the required tempering steps, such as heat treatment and carburization, with respect to the rotary shaft, or where uniaxial magnetic anisotropy is to be given to the surface of the rotary shaft, such dent forming may be carried out after the required step for giving such magnetic anisotropy is effected. Where spiral grooves are to be formed on the shaft surface by rolling or knurling, a rolling tool (die) having a multiplicity of protrusions scatteringly formed on its face is employed for the purpose, whereby spiral grooves and fine dents can be simultaneously formed.

Fine dents formed on the shaft surface may not necessarily be of strictly regular arrangement; they may be acceptable if they are substantially uniformly distributed. The diameter of each of the dents may be generally of the order of 0.1 to 1 mm. The coverage of the dents on the surface area (percentage of the area occupied by the dents to the area of the predetermined surface region) is preferably not less than 70%, more preferably not less than 90%. A depth of not more than 0.1 mm is sufficient for the fine dents; there is no particular need for any greater depth. Considering the fact that the depth (skin depth) of a passage within the shaft for a magnetic flux applied to the shaft surface by the frequency (about 10 kHz to 50 kHz) of a normally used exciting current is about 0.1 mm or less, it is well possible to provide the skin of the shaft, as a magnetic path, with above mentioned effect of fine-dent formation by forming fine dents of about 0.1 mm or less in depth.

The material of the rotary shaft to which the invention is applied is not particularly limited. Materials useful for the purpose include various different materials, such as carbon steel, chrome alloy steel, nickel-chrome alloy steel, chrome-molybdenum alloy steel, nickel chrome-molybdenum alloy steel, and maraging steel.

The system for magnetic excitation of the rotary shaft surface and detection of changes in magnetic permeability may be of a solenoid coil system using a solenoid coil concentrically wound along the outer periphery of the rotary shaft or may be of a magnetic head system using a magnetic head with a coil winding placed on a U-shaped iron core. For purposes of excitation/detection, any circuit configuration may be employed. In the torque sensor arrangement of the solenoid coil system in one embodiment to be described hereinafter, spiral grooves are formed in the surface of the rotary shaft to provide uniaxial magnetic anisotropy in which the direction of the angular inclination of the spiral grooves constitutes an axis of easy magnetization. Of course, such uniaxial magnetic anisotropy may be provided by any other suitable method. For example, a plurality of belt-like hardened sections which are angularly inclined relative to the axial direction are formed by laser quenching at a certain pitch in a circumferential direction, or belt like carburized sections inclined angularly relative to the axial direction are formed at a certain pitch in a circumferential direction, to arrange for provision of uniaxial magnetic anisotropy through the formation of such inclined belt like hardened sections or belt like carburized sections. Further, the torque sensor in the embodiment to be explained hereinafter has a differential-type construction in which two adjacent zones on the surface of the rotary shaft are provided with different uniaxial magnetic anisotropies which are equally angularly inclined relative to the axial direction but are inclined in reverse relation to each other so that changes in magnetic permeability in the respective zones are differentially sensed. However, such construction is not always required. Of course, it is possible to construct an excitation/detection circuit which detects the magnitude of torque applied to the rotary shaft and the direction of torque application, positive or negative (forward or reverse), on the basis of a change in magnetic permeability in only one zone provided with uniaxial magnetic anisotropy.

The arrangement described above have fine dents formed on the surface of the rotary shaft itself. However, if the shaft is formed of a material having minor or non magneto-strictive effect, it is possible to arrange that a sleeve made of a ferro-magnetic metal having greater magneto-strictive effect is firmly fitted and fixed to the desired surface portion of the rotary shaft by welding, bonding, shrinkage fitting, cold fitting, or otherwise so that stress resulting from the torque applied to the rotary shaft is transmitted to the sleeve, whereby a change in the magnetic permeability of the sleeve is detected. In this case, by forming fine dents on the surface of the sleeve it is possible to obtain improved hysteresis and improved sensitivity as in above described case. Therefore, the surface of the rotary shaft on which fine dents are formed, when referred to as such, means not only the surface of the shaft itself, but also the surface of the sleeve as a magneto-strictive member fitted fixedly to the shaft.

According to the invention, the hysteresis involved in the detection of torque of the rotary shaft is smaller and the detecting sensitivity is higher. With the improved hysteresis and sensitivity, highly accurate torque detection is possible and thus the reliability of torque detection in rotary drive system control is enhanced.

The principle of the invention that by forming fine dents on the surface of a ferro-magnetic element the magnetic properties of the element are changed is applicable not only to torque detection with respect to rotary shafts, but also to maintenance of various structures and management of changes of material characteristics with time and are through utilization of magneto-strictive phenomena. For example, when carrying out load measurement and maintenance of buildings, bridges, etc., maintenance and preliminary testing of plant equipment and high-pressure tanks, and/or measurement of residual stress distribution in welded structures, improved measurement accuracy and improved measurement reliability can be obtained by arranging that fine dents are formed at spots required to be measured.

DESCRIPTION OF EMBODIMENTS

Figure 1:
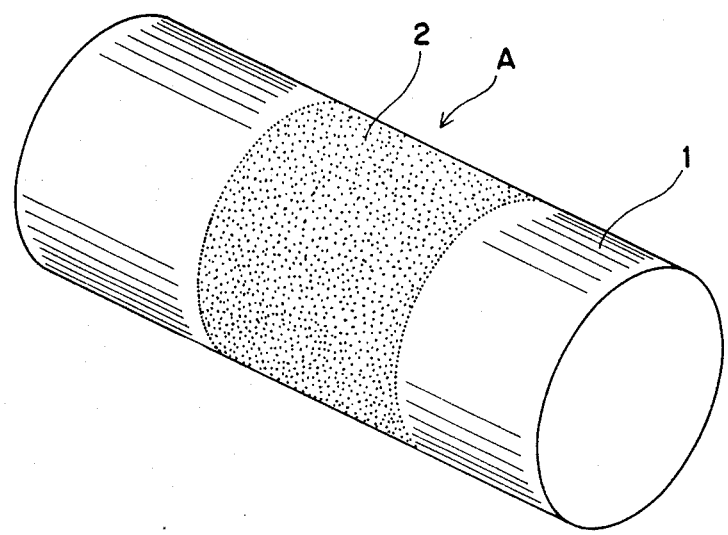
FIG. 1 is a perspective view of a rotary shaft having fine dents formed on its surface over a predetermined region in accordance with the invention.
Figure 2:
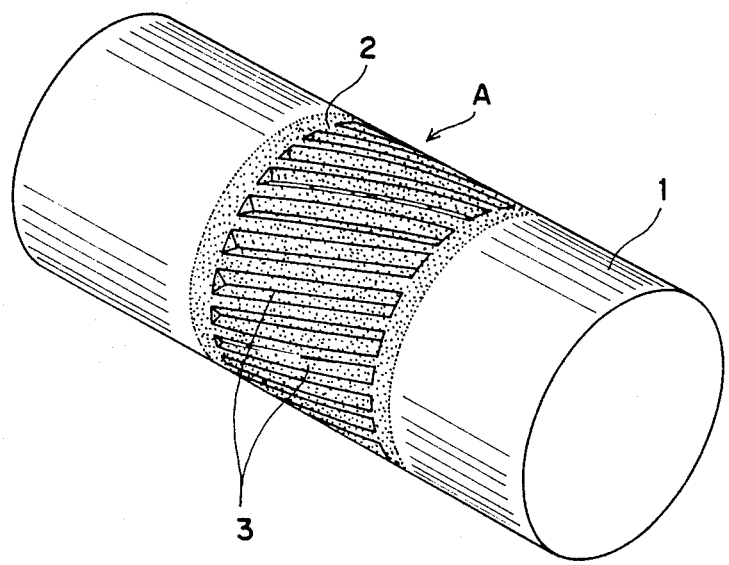
FIG. 2 is a perspective view of a rotary shaft having a multiplicity of spiral grooves formed thereon and fine dents formed over a predetermined region in accordance with the invention.

FIG. 1 shows an embodiment in which a multiplicity of fine dents 2 are formed on the surface of a rotary shaft 1 so that they are distributed over a predetermined region A. FIG. 2 shows another embodiment in which a multiplicity of spiral grooves 3 are circumferentially formed in spaced relation and in parallel to one another and in which a multiplicity of fine dents 2 are scatteringly formed on the rotary shaft in the region in which the spiral grooves are formed and also in adjacent areas.

An embodiment incorporating the rotary shaft shown in FIG. 2 will now be described in detail.

Figure 3:
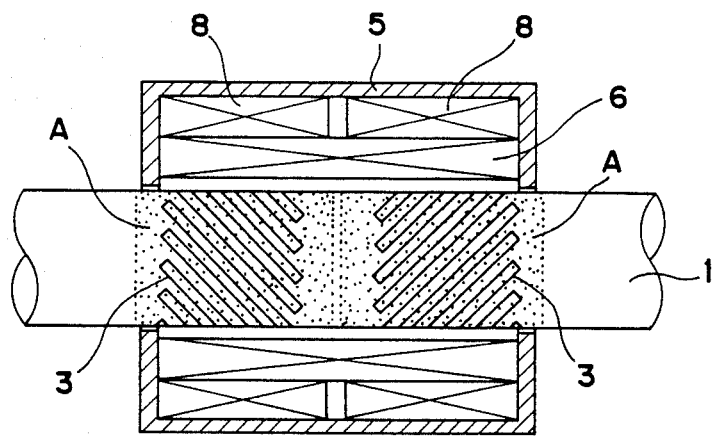
FIG. 3 is a sectional view schematically showing a rotary shaft in a magneto-strictive torque sensor according to the invention and exciting/detecting solenoid coils arranged around the rotary shaft.

The following rotary shafts (a) to (d) (all with a shaft diameter of 30 mm) are prepared, and they are all formed on their respective surfaces with same spiral grooves and fine dents as shown in FIG. 2. A solenoid coil type excitation/detection circuit as shown in FIG. 3 is arranged in conjunction with each of the rotary shafts to form a torque sensor. Torque detecting test was carried out with respect to each sensor.

(I) Rotary shaft

Rotary shaft "a"

(i) Shaft material: 4.3% Ni nickel-chrome molybdenum steel (ii) Heat treatment: primary hardening (930° C., oil quenched) → secondary hardening (850° C., oil quenched) → tempered (175° C. ×4 hrs, air cooled)

(ii) Tensile strength: 110 kg f/mm$^2$, hardness ($H_{RC}$):40

(iv) Magneto-strictive constant ($\lambda s$): $21 \times 10^{-6}$

Rotary shaft "b"

(i) Shaft material: 14% Ni nickel maraging steel (ii) Heat treatment: solution treatment (900° C.×1 hr, air cooled) → aging (480° C.×3 hrs, air cooled)

(iii) Tensile strength: 170 kg f/mm$^2$, hardness ($H_{RC}$): 49

(iv) Magneto-strictive constant ($\lambda s$): $22 \times 10^{-6}$

Rotary shaft "c"

(i) Shaft material: 8.5% Ni nickel chrome-molybdenum steel (ii) Heat treatment: quenching (830° C. air cooled) → tempered (560° C. air cooled)

(iii) Tensile strength: 140 kg f/mm$^2$, hardness ($H_{RC}$): 43

(iv) Magneto-strictive constant ($\lambda s$): $27 \times 10^{-6}$

Rotary shaft "d"

(i) Shaft material: 8.5% Ni nickel maraging steel (ii) Heat treatment: solution treatment (830° C.×1 hr, air cooled) → aging (515° C.×3 hrs, air cooled)

(iii) Tensile strength: 120 kg f/mm$^2$, hardness ($H_{RC}$): 35

(iv) Magneto-strictive constant ($\lambda s$): $21.5 \times 10^{-6}$ (II) Formation of spiral grooves and fine dents on shaft surface (i) Groove forming: In two adjacent areas (A), (A) on the shaft surface were formed, by roll forming process, series of spiral grooves having an angular inclination of 45 deg. relative to the axial direction of the shaft and oriented in opposite directions. In FIG. 3, belt shaped inclined patterns formed in two areas (A), (A) on the rotary shaft 1 represent spiral grooves 3, 3.

Groove depth: about 1 mm, groove interval: about 2 mm, groove length: about 10 mm.

(ii) Formation of fine dents: Steel balls (diameter of 0.1 to 0.6 mm) were used as shots. Shots spray velocity was 62 m/sec. In FIG. 3, dots scattered in the areas (A), (A) represent fine dents 2 formed by shot peening. The depth of each impression was about 0.1 mm or less. The shot coverage (area percentage) was 95 to 98%.

(III) Construction of torque sensor

Figure 4:
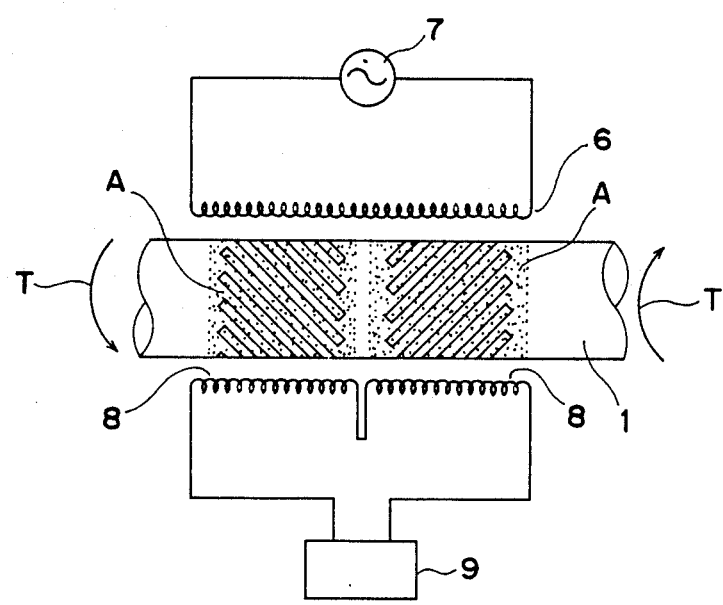
FIG. 4 is a schematic illustration showing an excitation/detection circuit in the magneto-strictive torque sensor of the invention.

Excitation/detection circuits were individually arranged on the rotary shafts (a) to (d) to form torque sensors (a) to (d). FIG. 3 shows the disposition of each excitation/detection circuit in relation to the corresponding rotary shaft 1. FIG. 4 shows the arrangement of the excitation/detection circuit. In the description to follow, the two areas (A), (A) having spiral grooves 3, 3 and fine dents 2 formed therein, on the surface of the shaft, are each referred to as "magneto-strictive sections".

In FIG. 3, numeral 6 designates a solenoid coil (exciting coil) for applying exciting field to the "magneto-strictive sections" (A), (A), and 8, 8 designate solenoid coils (detecting coils) for detecting changes in the magnetic permeability of the "magneto-strictive sections" (A), (A) which take place when torque T is applied to the rotary shaft 1. The exciting coil 6 and the detecting coils 8, 8, as FIG. 3 shows, are disposed concentrically in a casing 5, being positioned in proximity to the rotary shaft 1. As FIG. 4 shows, the exiting coil 6 is connected to a high-frequency excitation power supply 7. The detecting coils 8 and 8 are connected together in reverse polarity to detect differentially the changes of magnetic permeabilities of the two corresponding magneto-strictive sections (A), (A), their terminals being connected to a synchronizing rectifier 9. In the detecting coils 8, 8 there develop induced voltages due to mutual induction between them and the exciting coil 6, the difference between the induced voltages being outputted as a DC voltage from the synchronizing rectifier 9.

In this torque sensor, when no torque is applied to the rotary shaft, the magnetic permeabilities of the two magneto strictive sections (A), (A) are equal; therefore, an induced voltage developing in one detecting coil 8 and an induced voltage developing in the other detecting coil 8 are negated, one against the other, there being thus no output. When torque T is applied to the rotary shaft 1, one of the two magneto-strictive sections (A), (A) is mainly subject to tensile force and the other is mainly subject to compressive force. As a result, the magnetic permeability of the one magneto-strictive section is increased, while that of the other is decreased. Because of this differential change in magnetic permeability, the induced voltage at the one detecting coil 8 is increased and that at the other detecting coil 8 is decreased. This difference is outputted as a DC voltage from the synchronizing rectifier 9, and the magnitude of the applied torque T is detected from the magnitude of the output value, and the direction in Which the torque has been applied is detected from the positive or negative sign of the output value.

As comparative examples, rotary shafts a' to d' were prepared in same way as the foregoing rotary shafts a to d, except that formation by shot peening of fine dents on the surface of the region in which spiral grooves were formed was omitted. Same excitation/detection circuit as above described was arranged on each of the rotary shafts a' to d'. Thus, torque sensors a' to d' were formed.

(IV) Torque detecting tests and results thereof

With respect to each of the torque sensors a to d and also to each of the torque sensors a' to d', torque detecting tests were carried out by applying rated torque under magnetic field application to the magneto-strictive sections from a high-frequency power supply (exciting current: 40 mA rms, frequency: 10 kHz).

Figure 5:
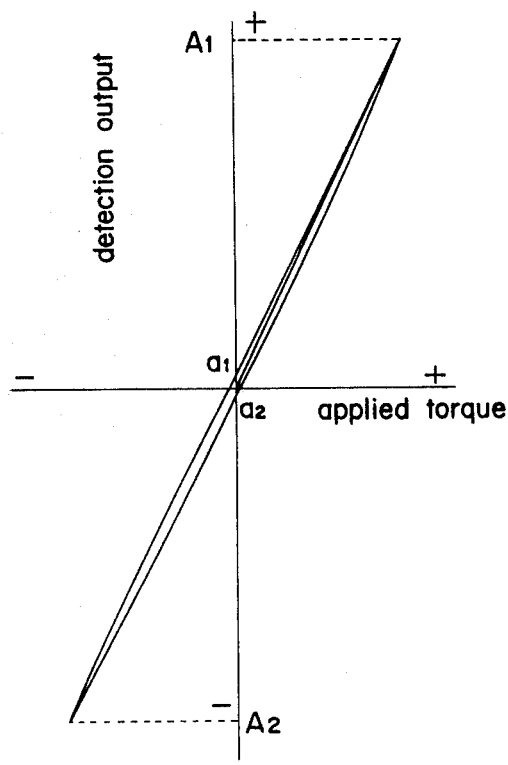
FIG. 5 is a graphical representation showing the torque detection characteristics of a magneto-strictive torque sensor representing one embodiment of the invention.
Figure 6:
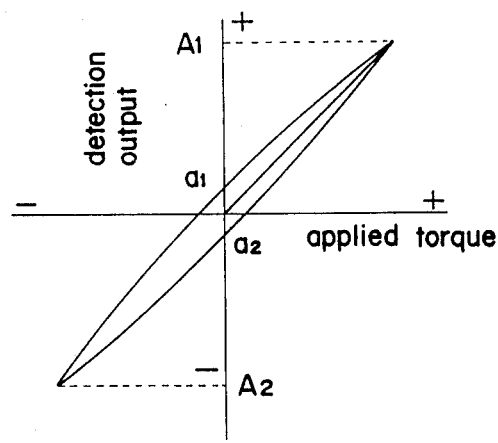
FIG. 6 is a graph showing the torque detection characteristics of a magneto-strictive torque sensor in a comparative example.

FIG. 5 shows the torque detection characteristics observed when the torque sensor a was employed, and similarly FIG. 6 shows the torque detection characteristics when the torque sensor a' was employed. The torque sensors can be compared with each other in the magnitude of hysteresis on the basis of the ratio of output value at zero torque application to output value at maximum torque application (($a_1-a_2)/(A_1-A_2) \times 100$) (%). In detection sensitivity, they can be compared with each other on the basis of the ratio ($\Delta mV/\Delta kgf \cdot m$) of detection output value increment ($\Delta mV$) to applied torque increment ($\Delta kgf \cdot m$).

The torque sensor a (FIG. 5) showed a hysteresis of 0.7% and a detection sensitivity of 37 (mV/kgf·m), Whereas the torque sensor a' (FIG. 6) showed a hysteresis of 3.5% and a detection sensitivity of 18 (mV/kgf·m). In other words, as compared with the torque sensor a', which was of the same construction as the torque sensor a except that it had no fine dents 2, the torque sensor a, which had fine dents 2 formed in the area of magneto-strictive section A on the shaft surface, showed good improvement in both hysteresis and detection sensitivity, that is, as low as about 1/5 in hysteresis and two times as high in sensitivity.

Figure 7:
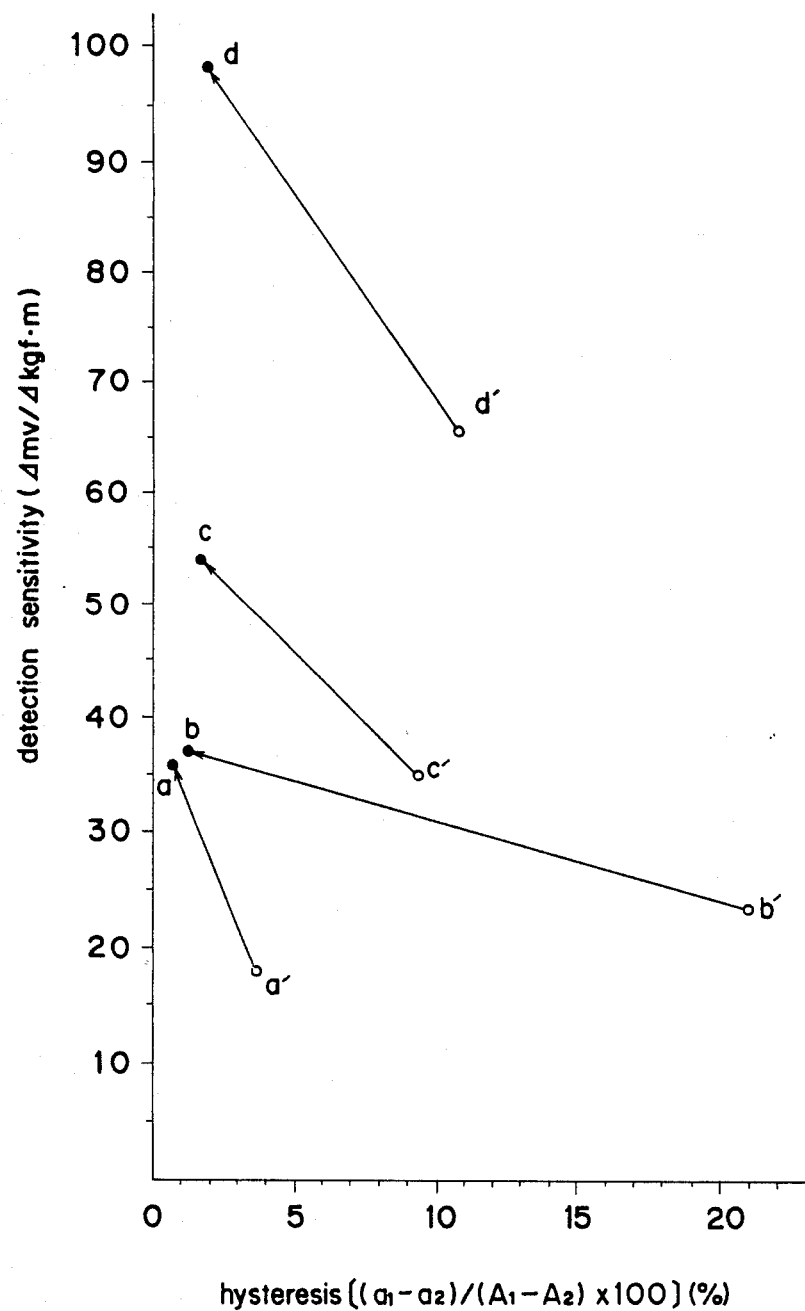
FIG. 7 is a graph showing hysteresis and sensitivity in torque detection when the embodiment of the invention is used, in comparison with those with the magneto-strictive torque sensor in the comparative example.

FIG. 7 shows the above mentioned test results with the torque sensors a and a' and, in conjunction therewith, the results of tests with other specimen torque sensors b to d and b' and d' in hysteresis (%) and detection sensitivity (mV/kgf·m). In FIG. 7, reference characters a–d and a'–d' designate individual torque sensors subjected to tests. Arrows directed from plot ○ toward plot ● individually indicate, with respect to rotary shafts of same kind, directions of changes in torque detection hysteresis and sensitivity due to the presence of fine dents. Hysteresis value (%) shown by individual plots are: b, 1.2% (b', 21%); c, 1.8% (c', 9.2%); d, 2% (d', 10.8%). With individual torque sensors, hysteresis is substantially reduced be cause of the presence of fine dents (downwardly changed to about 1/5 or lower in the case of sensors a, c, and d, and to about 1/20 in the case of sensor b); and with each of the sensors a, b, c, d, the hysteresis value is 2% or lower. Changes in detection sensitivity are different according to the material of the rotary shaft, but in all cases there can be seen a change for improvement because of the presence of fine dents 2.

In the case of the rotary shaft shown in FIG. 1, when torque is applied to the rotary shaft 1, "magnetic anisotropy due to applied stress" is imparted to the predetermined region A under the stress arising from the torque. Now, the rotary shaft 1 prior to the torque application has magnetic isotropy. As torque is applied, the direction of principal tensile stress due to the torque, that is, one direction of angular inclination of 45 deg. relative to the axis of the rotary shaft 1, becomes the direction of the axis of easy magnetization. On the contrary, the other direction normal to the axis of easy magnetization, that is, the direction of principal compressive stress, becomes the hard axis of magnetization. Accordingly, magnetization concentrates in the direction of the easy axis of magnetization under such applied tensile stress and little magnetization takes place in the direction of the hard axis of magnetization, magnetic anisotropy being thus imparted.

Figure 8:
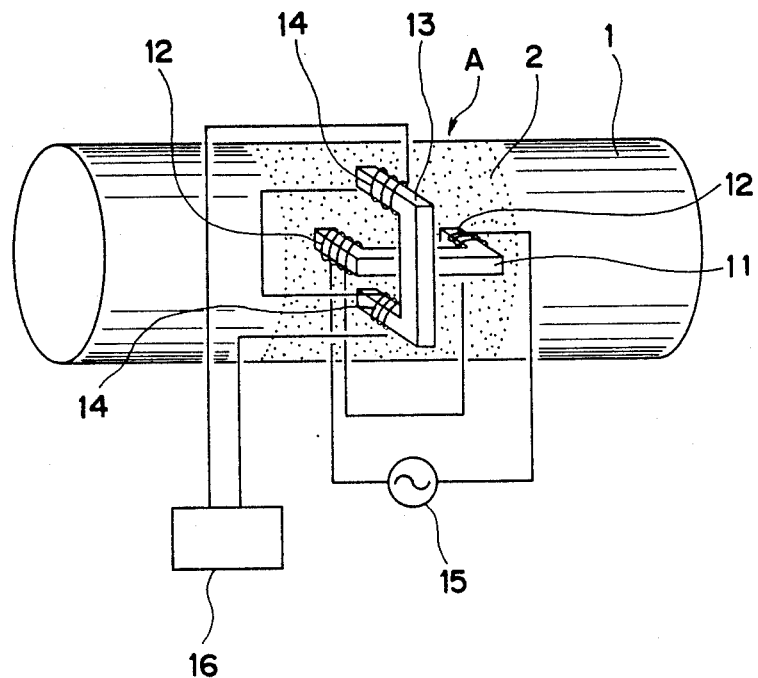
FIG. 8 is a perspective view of a magneto-strictive torque sensor having the rotary shaft shown in FIG. 1 and exciting/detecting heads arranged in conjunction therewith.

In such case, as FIG. 8 illustrates, magnetic excitation and detection of magnetic permeability changes are carried out by employing an exciting magnetic head having exciting coils 12 wound on an open magnetic circuit type iron core 11, and a detecting magnetic head having detecting coils 14 wound on an open magnetic circuit type iron core 13. In FIG. 8, numeral 15 designates an exciting high-frequency power supply, and 16 designates a synchronizing rectifier.

What is claimed is:

1. A magneto-strictive torque sensor of the type in which an exciting magnetic field is applied to a magneto-anisotropic zone formed on the surface of a predetermined region of a rotary shaft so that a change in the magnetic permeability of the magneto anisotropic zone which arises from torque being applied to the rotary shaft is contactlessly detected in terms of quantity of electricity, characterized in:

that fine dents and retainer areas for retaining residual compressive stress due to the fine dents are formed on the surface of the rotary shaft over a predetermined region including the magneto-anisotropic zone so that they are substantially uniformly distributed over the region.

2. A magneto-strictive torque sensor as set forth in claim 1 wherein the magneto-anisotropic zone consists of a multiplicity of spiral grooves formed in circumferentially spaced relation and in parallel to one another.

3. A magneto-strictive torque sensor as set forth in claim 1 where in the magneto-anisotropic zone is formed on the outer periphery of a sleeve fitted fixedly on the outer periphery of the rotary shaft.

4. A magneto-strictive torque sensor as set forth in claim 1 wherein the magneto-anisotropic zone is the rotary shaft surface itself to which magnetic anisotropy is imparted by stress acting on the rotary shaft.

5. A magneto-strictive torque sensor as set forth in one of claims 1 to 4 wherein the fine dents are formed by shot peening.

6. A magneto-strictive torque sensor as set forth in one of claims 1 to 4 wherein the fine dents are formed by a rolling process using an embossing tool having a multiplicity of fine protrusions on the surface thereof which is designed to be pressed against the surface of the rotary shaft.

7. A magneto-strictive torque sensor as set forth in one of claims 1 to 4 wherein the diameter of each one of the fine dents is within the range of 0.1 mm to 1 mm.

8. A magneto-strictive torque sensor as set forth in one of claims 1 to 4 where in the area occupied by the fine dents in the predetermined region of the surface of the rotary shaft is preferably not less than 70%, more preferably not less than 90%, of the area of the region.

9. A magneto-strictive torque sensor as set forth in one of claims 1 to 4 wherein the depth of each one of the fine dents is not more than 0.1 mm.

10. A magneto-strictive torque sensor as set forth in one of claims 1 to 4 wherein a work-hardened layer is formed, together with the fine dents, on the surface of the rotary shaft by the rolling process for forming the fine dents thereon.

11. An apparatus for contactlessly detecting in terms of quantity of electricity a change in magnetic permeability which is caused to a measuring object when stress is exerted on the object, characterized in:

that fine dents and retainer areas for retaining residual compressive stress due to the fine dents are formed on the surface of the measuring object so that they are substantially uniformly distributed over the region.

* * * * *

UNITED STATES PATENT AND TRADEMARK OFFICE
CERTIFICATE OF CORRECTION

PATENT NO. : 4,933,580
DATED : June 12, 1990
INVENTOR(S) : Renshiro Ishino et al.

It is certified that error appears in the above-identified patent and that said Letters Patent is hereby corrected as shown below:

Column 1, line 36, "exoiting" should read --exciting--

Column 1, line 38, "deteoting" should read --detecting--

Column 3, line 16, "magnetizatIon" should read --magnetization--

Column 5, line 33, "are" should read --age--

Column 7, line 59, "Which" should read --which--

Column 8, line 23, "Whereas" should read --whereas--

Column 8, line 46, "be cause" should read --because--

Signed and Sealed this

Sixteenth Day of July, 1991

*Attest:*

HARRY F. MANBECK, JR.

*Attesting Officer*   *Commissioner of Patents and Trademarks*